(12) United States Patent
Asmussen et al.

(10) Patent No.: US 7,262,408 B2
(45) Date of Patent: Aug. 28, 2007

(54) PROCESS AND APPARATUS FOR MODIFYING A SURFACE IN A WORK REGION

(75) Inventors: Jes Asmussen, East Lansing, MI (US); Timothy Grotjohn, Okemos, MI (US); Ning Xi, Okemos, MI (US); Timothy P. Hogan, Grand Ledge, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 11/452,891

(22) Filed: Jun. 14, 2006

(65) Prior Publication Data

US 2006/0284118 A1    Dec. 21, 2006

Related U.S. Application Data

(60) Provisional application No. 60/690,650, filed on Jun. 15, 2005.

(51) Int. Cl.
*G01N 13/16* (2006.01)

(52) U.S. Cl. ............... 250/306; 250/492.1; 250/492.2; 250/492.3; 700/121; 73/105

(58) Field of Classification Search ............... None
See application file for complete search history.

(56) References Cited

U.S. PATENT DOCUMENTS

2006/0275710 A1* 12/2006 Yamazaki et al. .......... 430/313

* cited by examiner

*Primary Examiner*—Nikita Wells
(74) *Attorney, Agent, or Firm*—Ian C. McLeod

(57) ABSTRACT

An apparatus and process for manufacturing changes of a substrate in a work region which is 100×100×100 microns or smaller is described. The apparatus uses a plasma source adjacent to the work region to produce radiation or matter which changes the surface. An atomic force microscope or laser can be used in addition. The process and apparatus can be used to produce MEMS devices on a substrate for use in a wide variety of applications.

16 Claims, 13 Drawing Sheets

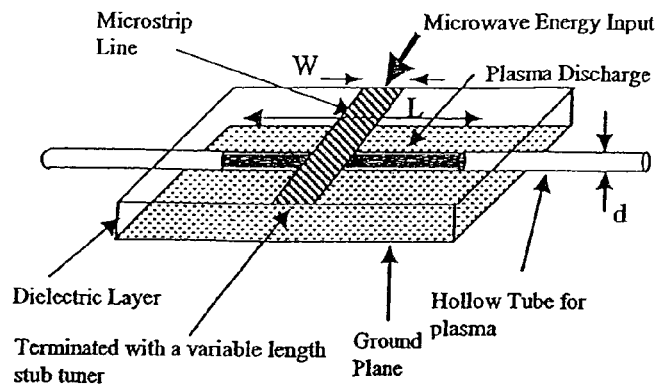
Figure 1
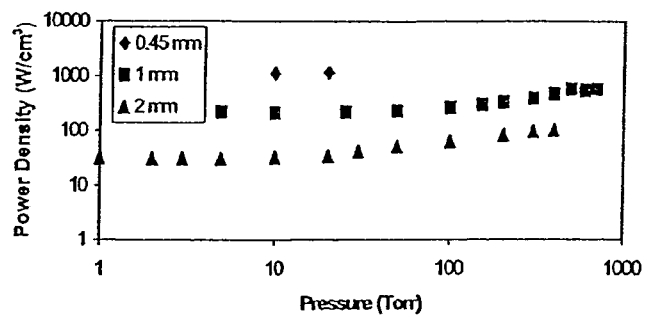
Figure 2
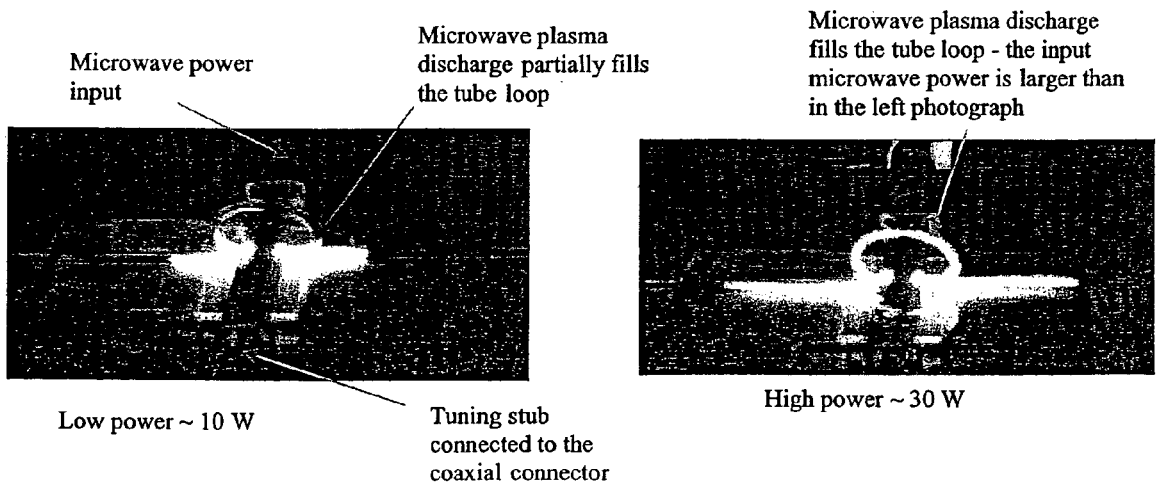
Figure 3A                                                                 Figure 3B

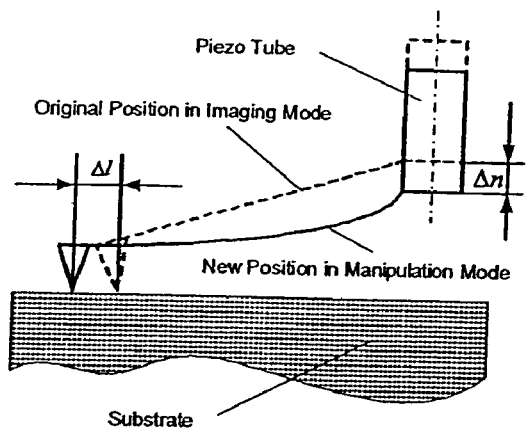
Figure 16
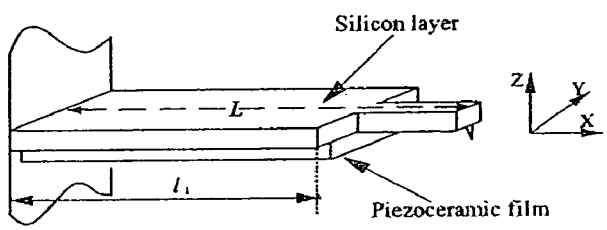
Figure 17
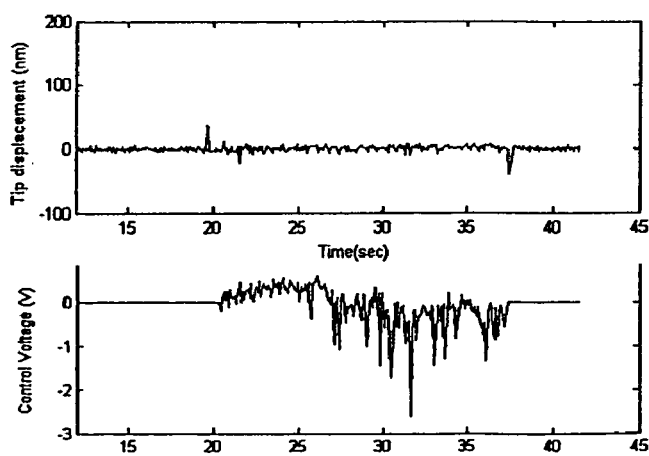
Figure 18A
Figure 18B

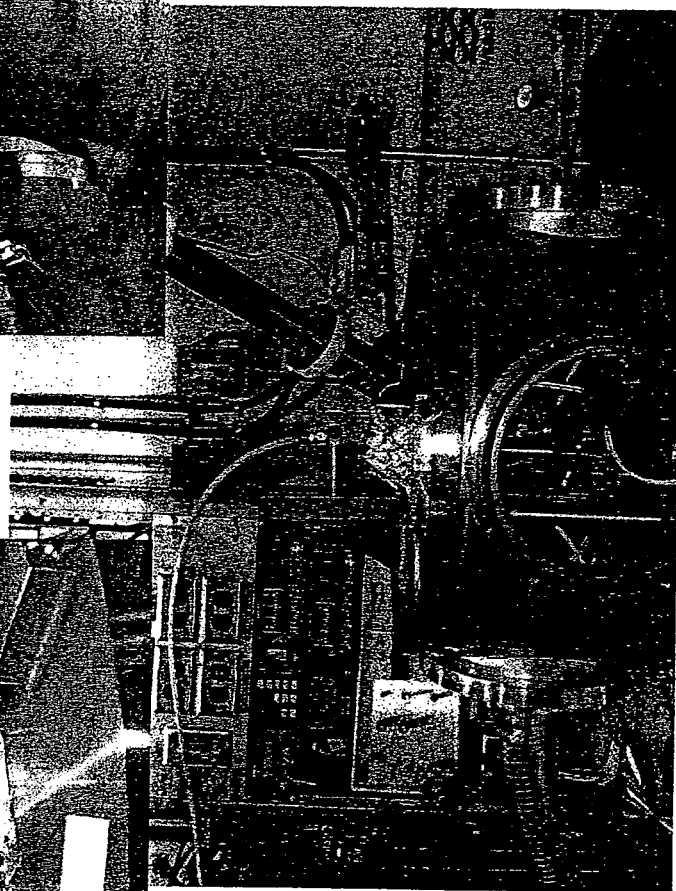
FIGURE 20C
FIGURE 20B
FIGURE 20A

PROCESS AND APPARATUS FOR MODIFYING A SURFACE IN A WORK REGION

CROSS-REFERENCE TO RELATED APPLICATIONS

This application claims priority to Provisional Patent Application Ser. No. 60/690,650, filed Jun. 15, 2005.

STATEMENT REGARDING GOVERNMENT RIGHTS

This invention was funded under National Science Foundation of Grant No. NSF03-043. The U.S. government has certain rights to this invention.

STATEMENT REGARDING FEDERALLY SPONSORED RESEARCH OR DEVELOPMENT

Not Applicable

BACKGROUND OF THE INVENTION (1) Field of the Invention

The present invention relates to an apparatus and process for modifications of a substrate in a work region which is 100×100×100 microns or smaller. A beam of radiation or matter (for instance light, electrons, atoms, and particles) is impinged on the work region to change the surface for instance by etching, welding, machining and fabrication of components in the work region. Preferably an atomic force microscope is used to determine the progress of changes in the work region and in some instances to position objects in the work region using the sensing probe.

(2) Description of the Related Art

One fundamental problem exists in terms of developing nano devices: complexity still remains in manufacturing these devices repeatably and reliably. That is, presently, unlike Integrated Circuit (IC) technology, there is no universally accepted method to make nano devices, even for devices as simple as a carbon nanotube connected between two electrically conductive pads. Consequently, only very simple interconnects and geometries have been reported thus far for nano devices. This is understandable since the fabrication of nano devices usually involves the integration of components based on different materials and fabricated by different processes than are employed by the IC industry.

The traditional batch process used in the IC industry is not able to produce and assemble such components on a nano scale. New manufacturing processes are required that combine both continuous and discrete manufacturing processes and integrate both top-down and bottom up approaches. In essence, the research and development in assembly, batch fabrication, and packaging of nano devices are still in a preliminary stage. Hence, unlike for IC manufacturing, the difficulty in fabricating parametric designs of a particular nano device for extensive tests and measurements is a great concern for nano technologists. Therefore, the development of technology to reliably build nano devices will directly further the evolution of nanoscale devices such as NEMS (Nano Electronic and Mechanical Systems) and nano circuits and sensors, in terms of the throughput and long-term reliability of nano devices.

One of the major challenges in the advancement of nano technology is to develop nanomanufacturing processes that reliably and efficiently produce nano devices and systems. This is the essential step to bring the results of research on nano science to applications. In general, a manufacturing system includes the processes of removing or adding (growing) material, and dividing, joining or assembly of different materials. These are the basic processes in nanomanufacturing.

OBJECTS

An object of the present invention is to provide the processes and related equipment for adding/removing, and dividing/assembly of materials and parts in the work region in order to achieve the reliable and efficient manufacturing of micro or nano devices and systems. It is further an object of the present invention to provide reliable processes and equipment for the nanoscale manufacture of micro or nano devices.

BRIEF DESCRIPTION OF DRAWINGS

FIG. 1 is a perspective view of a microstripline applicator with the discharge container located between the microstripline and the ground plane. The application can produce plasmas.

FIG. 2 is a graph showing power density versus pressure for an argon discharge with discharge tube diameters of 0.45 mm, 1 mm and 2 mm with a microwave power of 15W. The applicator of FIG. 1 was used.

FIGS. 3A and 3B are photographs of a microwave excited surface wave plasma propagating along a curved tube with the configuration of FIG. 1.

FIG. 16 is a schematic view showing position error in lateral direction caused by the deformation of the AFM cantilever.

FIG. 17 is a schematic view of an active controlled AFM cantilever probe.

FIGS. 18A and 18B are graphs of the deflection and piezo control signal of a active controlled AFM cantilever.

FIGS. 20A, 20B and 20C are photographs of a microstripline applicator for providing the opening of FIG. 19.

SUMMARY OF THE INVENTION

Figure 4:
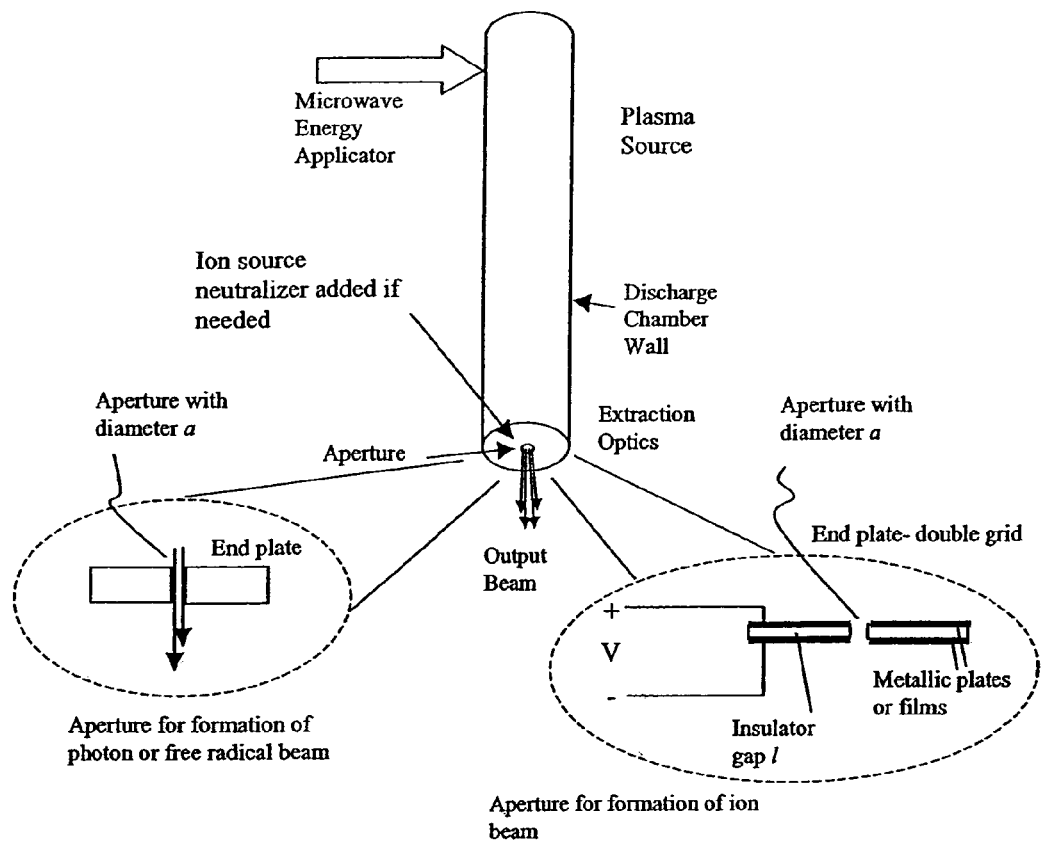
FIG. 4 is a schematic view of a plasma source with extraction optics.

The present invention relates to a process for manufacturing changes of a substrate which comprises:

(a) providing a substrate with a surface on a stage which provides a 100×100×100 microns or smaller work region which allows positionally accurate three dimensional movements in a work environment; and (b) impinging beams of matter or radiation from an adjacent plasma source having a beam with a cross-sectional width of 100 microns or less into the work region to modify the surface of the substrate in at least one dimension. Preferably the plasma source is computer controlled.

The present invention also relates to an apparatus which comprises:

(a) a stage for a substrate to be modified in a work region which is 100×100×100 microns or less on the substrate; and (b) a plasma source which can impinge a beam of matter or radiation from an adjacent plasma which is 100 microns or less in cross-sectional width into the work region so as to modify the surface of the substrate in at least one dimension. Preferably the plasma source is moveable and computer controlled.

The present invention also relates to a process for manufacturing devices by modifications of a substrate on a micron or less scale which comprises:

(a) providing a substrate with a surface which provides a 100×100×100 microns work region or less on a stage of an apparatus which allows precisely accurate three dimensional movement in the work region;

(b) viewing the substrate with an imaging device with a screen for visualization of the work region of the substrate in three dimensions;

(c) impinging beams of matter or radiation from a plasma source adjacent to the work region having a beam cross-sectional width of 100 microns or less in width into the work region on the surface to modify the substrate in at least one dimension in the work region; and (d) viewing the modified surface of the substrate with the imaging device to determine that the substrate has been modified to provide the device. Preferably the beam is free radicals, ions or atoms as the matter which modifies the substrate.

Preferably the beam is as free radicals, electrons, ions or atoms which modify the substrate. Also preferably a laser beam is used in addition to the plasma source to modify the surface. Preferably the imaging device is an atomic force microscope with a probe contacting the surface of the substrate to determine changes on the substrate over time during the process. Also preferably the probe provides manipulation of components placed on the substrate to position the components for integration onto the substrate by the beams. Also preferably the probe is used to cut into the surface of the substrate.

Preferably the beam is of the matter as a plasma which modifies the surface of the substrate by etching. Preferably the beam is of the matter as a plasma which modifies the surface of the substrate by depositing a material on the surface from the plasma. Preferably the material deposited is a welding material on a component mounted on the surface of the substrate. The devices can be MEMS devices.

The substance and advantages of the present invention will become increasingly apparent by reference to the following drawings and the description.

DESCRIPTION OF THE PREFERRED EMBODIMENTS

To address the need of new manufacturing processes for adding/removing material at the nanoscale, this invention provides a plasma-assisted processing system capable of localized surface modification, including etching and deposition, with processing areas of diameters preferably less than 1 micron (i.e. nanoscale dimensions). The invention uses mini-micro plasma sources and robotic controls to provide new plasma-assisted nanomanufacturing machines and associated processes. Plasma source technology is combined with the robotic controls and know-how to integrate the plasma assisted tool into a nanomanufacturing workcell or work region. This nanomanufacturing workcell is preferably operated on by an AFM based robotic nano manipulation tool that directly addresses the need for new manufacturing mechanisms for dividing/assembly material/parts in a nano environment. As a result, the integrated nanomanufacturing workcell is capable of nanomachining and assembling three dimensional structures and devices. In addition, the workcell is preferably provided with an AFM based visual inspection of the surface(s) between processing sequences. These inspections serve as a method of monitoring the shaping and assembly during the nanomanufacturing and enable the assessment of the manufacturing process itself.

The preferred feature of this plasma-assisted manufacturing workcell is the incorporation of several micro/nano plasma processing sources that are capable of producing a controllable, low energy and selective nano-scale beam of ions, electrons, free radicals or UV photons. Each individual source has a processing area of preferably less than one micron. The sources are position controlled with nanometer resolution, thus each source can be precisely positioned and manipulated for processing requirements. The type of processing that can be done with such sources includes surface activation, etching, ion milling/sputtering, plasma-assisted deposition and UV light activation of surfaces and processes. Because of the ability to produce free radicals, interesting surface processing and deposition processes can be achieved with sub-micron resolution.

The integration of the plasma-assisted tool with the AFM based robotic system facilitates the nanomanufacturing workcell with the capability of positioning, and manipulating the components and parts, as well as the tools with nanoscale accuracy. This also enables the workcell to handle both topdown and bottom-up manufacturing processes, and the components fabricated by different processes and with different materials. U.S. Pat. No. 6,862,924 B2 to Xi et al assigned to a common assignee, which is incorporated herein by reference, describes the use of a cantilever tip of an atomic force microscope (AFM) for nanomanipulation.

Major merits of the invention include a nanoscale plasma-assisted tool for material processing on the nanoscale; the AFM based robotic tool for manipulation of nano components and parts; the integration of the plasma-assisted tool with the AFM based robotic device to form an automated nanomanufacturing workcell; and the use of the novel nanoscale sensing devices using the nanomanufacturing workcell.

An array of these sources is used to do direct ion beam process and plasma assisted etching or deposition without lithography steps. The plasma sources can be turned-on and turned-off as the piece being processed is scanned. This lithography free approaches especially attractive when the device being fabricated requires 10's to 100's of different lithography steps to implement, which is the number of processing steps as is envisioned for many nano devices and sensors constructed from a variety of materials.

The invention relies on several specific technologies. The invention uses plasma source and plasma process invention, robotic control, and fabrication of MEMS and nanostructures. Microwave powered miniature plasma sources are used. Plasma sources with discharge dimensions as small as 200 microns have been developed as described in U.S. application Ser. No. 60/560,145 filed Apr. 7, 2004, now U.S. patent application Ser. No. 11/100,253, filed Apr. 6, 2005 and assigned to a common assignee, which is incorporated herein by reference. A second technology that is important to this invention is the use of thin membrane materials with an aperture opening that is placed on one end of the plasma source for extraction of ions and free radicals. This membrane must be thermally robust, thin and strong. The growth of nanocrystalline diamond membranes as described in U.S. application Ser. No. 10/073,710 filed Feb. 11, 2002 which is incorporated by reference and assigned to a common assignee, particularly fulfils the requirements for such a membrane. There are numerous U.S. patents which describe nanocrystalline diamond. The implementation of the plasma sources into a nano-scale processes uses tools and processes for fabrication and assembly of nano devices using AFM technology and art of fabricating MEMS devices and growing nanowires. One Patent is U.S. Pat. No. 6,862,924 to Xi et al.

Microwave discharges have been developed, investigated and used for many applications ranging from IC wafer processing, environmental remediation, PACVD coatings, free radical generation for ashing, cleaning and sterilization, and ion production for ion sources. Microwave discharges have many desirable characteristics: (1) they are able to produce high densities of process species and (2) they are electrodeless. The relevant patents are: U.S. Pat. Nos. 4,585,668; 4,792,772; 4,727,293 and 5,311,103 to Asmussen et al. These characteristics allow high processing rates while reducing problems of contamination and limited lifetime due to electrode erosion. Microwave discharges can be operated over a wide range of pressures (mTorr to over one atmosphere) with a wide range of plasma densities including charge densities well above the critical density. One consequence of the use of high frequencies and their associated high charge densities is the low discharge sheath potential. This low sheath potential reduces damage caused by ion and electron bombardment that can occur in DC and lower frequency driven plasmas. Finally, microwave discharges can be formed in almost any gas mixture including chemically reactive gases desired for processing applications. These many desirable characteristics make microwave discharges excellent choices for this invention.

Recent investigations concerned with the scaling and application of high frequency plasma sources to small dimensions was initiated by Hopwood which is incorporated by reference herein, in the frequency range of 100-400 MHz. In other work, Bilgic et. al., "A new low-power plasma source using microstripline technology for atomic emission spectroscopy," Plasma Sources Science and Technology, 9, 1-4, 2000, which is incorporated by reference herein described a miniature plasma loaded applicator where the miniature plasma discharge is operated at 2.45 GHz. Miniature Microwave plasma source technologies with dimensions as small as 200 µm as set forth in U.S. Pat. No. 6,759,808 to Grotjohn et al, which is incorporated herein by reference, have been developed. Thus the ability to create mini/micro microwave discharges using a compact excitation microwave circuit has been demonstrated.

Nanomanufacturing requires fabricating and assembly of nano components in complex 2D and 3D structures. The techniques used can be classified into "bottom-up" and "top-down" methods.

Self-assembly is one of the main approaches in "bottom-up" methods. It can be applied to make regular, symmetric patterns of nano structures. However, many nano structures and nano devices have asymmetric patterns that cannot be easily manufactured using self assembly. A "top-down" method would be desirable to fabricate complex nano structures, especially the structure requires using different materials, and fabricated with different processes.

Atomic force microscopy (AFM) has been shown to be a powerful tool to study sample surfaces down to the nanometer scale. Not only can it characterize samples surfaces, it can also change the sample surface through manipulation. Therefore the AFM is considered as a promising tool for "top-down" nanomanufacturing. In recent years, many kinds of AFM-based nanomanipulation schemes have been developed. The main problem with existing AFM-based manipulation schemes is based on the scan-design manipulation-scan approach. It is very time consuming and makes mass production impossible. Recently, some researchers are trying to combine the AFM with haptic technique and virtual reality interface to facilitate nanomanipulation. Although a virtual reality can display a static virtual environment and a tip position in the virtual reality model, the system does not provide any real-time display during a manipulation. Due to the thermal drift and other uncertainties, the virtual reality model can have significant errors. Therefore the operator is still blind during a manipulation because he/she cannot see the environment changing in real time.

The complexity of nanomanufacturing requires the accurate positioning and assembly of nano components. In order to precisely position the nano component, it is important to provide a technique to compensate the thermal drift and cantilever deformation during manipulation. In order to make the manipulation reliable and efficient, it is necessary to develop automatic manipulation using collision-free paths. Typically manual nano manipulation is complex and time-consuming. The paths are obtained in an interactive way between the users and the AFM images, which is inefficient and error-prone. Automatic Path planning is crucial for nanomanufacturing. Automatic path planning for nanomanufacturing has not received much attention. Makaliwe et al., "Automatic planning of nanoparticle assembly tasks," in Proc. IEEE Int'l Symp. On Assembly and Task Planning, Fukuoka, Japan, May 2001, pp. 288-293, developed a path planning algorithm for nanoparticle assembly. Issues related to the object assignment, obstacle detection and avoidance, path finding and sequencing are addressed. But the approach only considers the obstacles in the shape of polygons. Also the collision of destinations has not been discussed. In addition, the objects (nanoparticles) may be lost in the manipulation process. Therefore, it is important to develop "lost and-found" techniques to recover the object.

To make nanomanufacturing reliable and efficient, it is essential to develop a general framework to model and design the manufacturing processes for nano structures and nano devices. A combination of both theoretical (analytical and computational) and experimental methodologies can be used to address the underlying necessities for nanomanufacturing.

Electrodeless plasma sources of various types have been developed and extensively characterized via modeling and experimental diagnostics. They have also been commercialized and applied to a number of applications.

Some of the inventors and others investigated small microwave plasma sources with discharge dimensions ranging from 0.3-10 mm. The emphasis in this project was on developing plasma sources that operated without the electrode erosion and contamination problems of small plasma electrode-based systems that are used in arc systems and plasma displays. Small microwave discharges were shown to operate with low input power, while having very high power densities and highly reactive species outputs. The low input power feature allows the sources to operate with coherent and controllable power supplies currently available for mobile communication systems with power levels of one to a few watts. The microwave plasma system based on microstripline technology has been created and implemented for the experimental investigation of miniature size plasmas (U.S. Pat. No. 6,759,808).

Effective research activities have been carried out in the area of action planning and control of robotic systems. Many new research results of a fundamental nature have been obtained.

The specific technical aspects of this invention are to (1) provide several micron scale plasma sources that emit output beams of ion, free radicals or UV photons, (2) provide several single aperture end plates or a grid that are attached to each plasma source and focus and control the various nanometer sized (10's-few 100 nm diameter) output beams, (3) provide a AFM based robotic nano manipulation system to position and manipulate with a nano meter accuracy, (4) integrate the plasma-assisted tool with the AFM based obotic nano manipulation system to form a automated nano manufacturing workcell, and (5) provide the system by manufacturing a nanoscale sensing system. The applications demonstrate the ability to add/remove material, and divide/assembly components and parts of three-dimensional shapes with nanoscale accuracy.

Several micro plasma sources that include plasma discharge chambers with appropriate cooling, electrodes and apertures, plus the microwave stripline and transmission system are used. One source is a nanoscale ion beam source with ion beam energies from 50-few 100 eV. A second source is a free radical source capable of operating in several gases and a third plasma is a UV light source operating with gas or gas mixtures to generate desired UV light output. The preferred minimum size for the ion, free radical and photon beams is 50 nm in diameter. In the process a grid/aperture technology is used. These sources are incorporated into a nanoscale processing system. The sources are mounted adjacent to existing AFM technology allowing the operation of a plasma source and subsequent AFM imaging. The source is mounted with nanometer resolution position control. Evaluation of both deposition and etching processes is done initially on flat surfaces and then the processing is applied to more complex three dimensional shapes.

Plasma source development makes use of the microwave stripline apparatus of U.S. Pat. No. 6,759,808. In this earlier work microwave plasmas were produced inside cylindrical tubes with diameters, d, as small as 200 micrometers. As shown in FIG. 1 microwave discharges were produced inside small cylindrical tubes placed perpendicular to the coupling stripline conductor. A plasma surface wave discharge was excited along the discharge tube, and as input power was increased from low powers to higher power levels the discharge length, L, increased producing variable length discharges. The discharge lengths varied from very short lengths, i.e. L~d, to very long lengths, i.e. L>>d. Cylindrical discharges with diameters and lengths as small as 200 micrometers can be sustained with only a few watts of input power. By increasing the input power variable length discharges were created and discharge lengths of many centimeters were achieved.

These micro microwave discharges can be efficiently sustained in a variety of diameter tubes and in many gases, i.e. inert gases, hydrogen, nitrogen etc., and gas mixtures from low pressures of a few mTorr to over one atmosphere. The discharges are intense and have high plasma densities. For example (see FIG. 2 for experimental measurements), a 1 mm diameter discharge operating with 5% hydrogen in argon at pressures of 10's of Torr has a power density of several 100 W/cm$^3$ and the electron/ion densities are of the order of $10^{12}$ cm$^{-3}$ at the low mTorr pressures and are above $10^{14}$ cm$^{-3}$ in the higher operating pressure regime. As shown in FIG. 2 smaller diameter discharges are even more intense having power densities of around 1000 W/cm$^3$. It is important to note that while the discharge power densities are high the total absorbed power is low. Typical absorbed power levels are a few Watts for short discharges, and increase to 10's of Watts for multi-centimeter long discharges. Thus these versatile, and intense discharges can be operated with low power, 25-150 Watt solid-state microwave power supplies.

FIG. 3 visually displays the discharge behavior versus input power. At low input power the discharge occupies a small length; i.e. the region defined by the width, w, of the microstripline. At higher powers the discharge expands via surface wave excitation following the curved/looped tube and entirely fills the loop and also extends well beyond the microstripline excitation region. As input power is varied the discharge length can be varied thereby allowing the formation of short discharges of a few millimeters in length, or if desired with the application of higher power inputs multi-centimeter long, intense plasmas are achieved.

The above described unique features of the micro discharges allow the development of several efficient and compact plasma sources. In the present invention one plasma source is used for low (10-400 eV) and variable energy ion beam extraction. A second source produces a beam of free radicals for specific processing applications and the third produces a beam of photons. All sources are preferably cylindrical. However they differ in length and diameter and in beam extraction "optics". For example, the photon source is a long straight cylinder that produces and enables the transmission of the intense photon flux that propagates along the tube axis. The ion and radical sources are shorter. However each source operates at different pressures which are chosen to efficiently yield the appropriate output beam. Each source is connected to a compact microstripline coupling applicator as in FIG. 1. The microwave coupling circuits are much more compact than the "bread board" prototype circuits displayed in FIGS. 1 and 3, so that they are incorporated into a nano-scale robotic controlled positioning stage. Finally each source is driven and controlled by a commercially available 2.45 GHz, solid state power supply. Thus the complete plasma source system is efficient and compact and is easily configured into the manufacturing cell.

A typical proposed microwave excited source design is shown in FIG. 4. The diameter of the discharge chamber is 1 mm or less. At this diameter and at operating pressures of 10 Torr-1 atmosphere the plasma density is in the $10^{14}$ cm$^{-3}$ range. By exciting a plasma surface wave the discharge can be extended to the end of the discharge tube where an end plate, or more specifically the source beam optics is located. The beam optics design varies according to the beam type, however all applications have a single small aperture. This aperture has a diameter in the nano to micro scale and is configured so that the beam species, i.e. ions, radicals or photons, can exit from the source. Specific diameters of the apertures range from 50 µm down to 50 nm. The neutral and photon beams simply stream out of the end of the cylindrical discharge chamber through the aperture without the need of complex aperture optics; that is the free radical or photon beams have a divergence based on the discharge pressure, temperature and aperture shape and size. However the ion extraction end plate has ion extraction optics.

Ion extraction requires a single extraction grid or multiple extraction grids to select and accelerate the ion beam to the desired energy. There are several issues that are considered when designing such an extraction grid system including (1) the maximum current density that can be extracted from the discharge plasma, (2) the extracted current density versus the applied voltage, i.e. Child's Law, (3) ion beam focusing, (4) impressed maximum electric field considerations, and (5) discharge and downstream operating pressures. Each of these considerations is discussed below.

The maximum ion current density that can be extracted from a plasma is equal to the maximum current that is produced by the ions diffusing to the discharge walls. This maximum current is given by $J_i = e n_s (eT_e/M)^{1/2}$ where M is the mass of the ion, e is the electron charge, $T_e$ is the electron temperature in eV, $n_s$ is the plasma density at the edge of the sheath and $n_s = 0.0.67 n_e$ where $n_e$ is the plasma density at the center of the discharge.

The ion current that is extracted from a single aperture of ion optics is governed by Child's Law. According to Child's law the space charge limited current, I, capacity for a aperture of diameter a is $I = (\pi \epsilon_o/9)\sqrt{2e/M} V^{3/2} a^2/l^2$ where $\epsilon_o$ is free space permittivity, V is acceleration voltage and l is the acceleration length.

The nano/micro-scale ion source has an ion extraction grid system placed on the end of the plasma source. Two types of ion extraction systems are considered, (1) a single grid system and (2) a double grid system. A double grid system is indicated in FIG. 4. The ion current that can be extracted from a single aperture, double grid ion extraction system is determined by Child's Law as described above. If we assume argon ions, a=l, and V=100 volts the current capacity of an aperture where a=l is approximately 6 µA. For apertures of 10 µm, 1 µm and 100 nm in diameter this corresponds to current densities of 7.6 A/cm$^2$, 760 A/cm$^2$, and 76,000 A/cm$^2$, respectively.

The micro microwave discharges have typical plasma densities of $10^{14}$ cm$^{-3}$ and electron temperatures of 1-few eV. Thus the maximum extracted current density, $J_i$, is in the range of 1-4 A/cm$^2$. These current densities are less than the current densities limits indicated by Child's law. Therefore the limiting factor in terms of current for holes smaller than 3-5 µm is the discharge ion saturation current flux to the aperture. With this established the maximum current flow from a grid extraction system can be determined. For apertures of 5 µm, 1 µm, 100 nm and 50 nm with a current density of $J_i = 2$ A/cm$^2$ the maximum beam currents will be 0.4 mA, 16 nA, 160 pA, and 40 pA respectively.

For the extraction grid to operate properly, the diameter of the aperture or apertures needs to be less than a few Debye lengths. If the aperture is too large for a given plasma density the plasma extends out through the aperture and the extraction grid does not focus properly unless very large voltages are applied to the grid (Note that we expect to be operating with 10-300 eV accelerating voltages). The Debye length, $\lambda_{De}$, is given by $\lambda_{De} = (\epsilon_o T_e/e n_e)^{1/2}$ where $T_e$ is the electron temperature in eV and $n_e$ is the plasma density. For an electron density of $10^{14}$ cm$^{-3}$ and $T_e$ in the range of 1-few eV, the Debye length is approximately 1 micrometer. So the diameter of the aperture needs to be 3-5 µm or less for a plasma density of $10^{14}$ cm$^{-3}$. A key limiting factor in the design of ultra-small ion extraction grids is the electrical breakdown of the gap between the grids. The voltage that can be sustained across a gap is difficult to determine for the small aperture sizes being considered. The breakdown voltage is a function of the dielectric spacing between the grids, the pressure, the gas present in the apertures, etc. The work of Kaufman and Robinson indicates that the maximum electric field for gaps on the order of 100's of micrometers is 5 V/µm for pressures below 10 mTorr. At higher pressures the breakdown is given by the Paschen curve which, for example, predicts a breakdown electric field of 3V/µm for air at atmospheric pressure. Fortunately for this invention where gaps are less than a few micrometers, the breakdown phenomenon shows an increase in the electric field needed to initiate breakdown. This is because the breakdown process is an avalanche process where the electrons must be accelerated and travel a sufficient distance to collide with another atom/ion to get an additional electron. If this gap distance is small enough the breakdown electric field increases. In fact, what happens is the breakdown changes from being Townsend avalanche phenomenon to being a process governed by field emission of electrons from the electrodes. In this small gap region a modified Paschen curve must be applied. For air at atmospheric pressure the small gap breakdown electric field is approximately 75 V/µm. Work by Wallash and Levit, (Wallash et al., Electrical breakdown and ESD phenomena fro devices with nanometer-to-micron gaps, SPIE Conference, January 2003) reported breakdown electric field strengths of 156 V/µm for atmospheric pressure air for a gap of 0.9 µm. Schaffert (Schaffert, R. M., Electrophotography, John Wiley and Sons, 1975) reports a value of 80 V was reported for breakdown with a 0.12 µm air gap. This corresponds to an electric field of 660 V/µm. Hence, for our application the maximum voltage that can be applied to accelerate the ions is determined experimentally, and depends on the plasma gas type, insulating gap material and grid surface smoothness.

Another consideration for this nanoscale/microscale ion source is the pressure of the extraction grid region and the down stream region. For argon ions in the range of 10-100 eV of energy the mean free path for ions is approximately 100 µm at 1 Torr, 10 µm at 10 Torr and 1 µm at 100 Torr. If the distance from the source extraction grid to the substrate is kept less than 1 µm, the pressure in the processing chamber can be operated as high as several 10's Torr. The thickness of the extraction grid and the distance from the extraction grid to the substrate being processed needs to be less than or on the order of the ion mean free path. An additional factor that influences the spacing between the ion extraction aperture and the substrate is the beam divergence. For values of a≈1 and the proper selection of extraction grid potentials the half-angle beam divergence can be as small as 6 to 8 degrees. So for a nanoscale ion source operating with a plasma density of $10^{14}$ cm$^{-3}$ and with an aperture diameter of 50 µm, the current expected is 40 pA with a beam diameter of 100 nm at a working distance of 200 nm from the source to the substrate.

The beam optics for the free radical and photon sources are very simple. The first approach will be to build an end plate with a simple small aperture. This aperture and end plate is adjusted for the desired beam diameters and if necessary for the free radical source it may include some aerodynamic shaping to obtain a collimated beam. These end plate apertures are fabricated using conventional MEMS fabrication techniques and they also make use of the aperture fabrication techniques described previously such as fabrication of plasma source and small aperture extraction optics.

Figure 5:
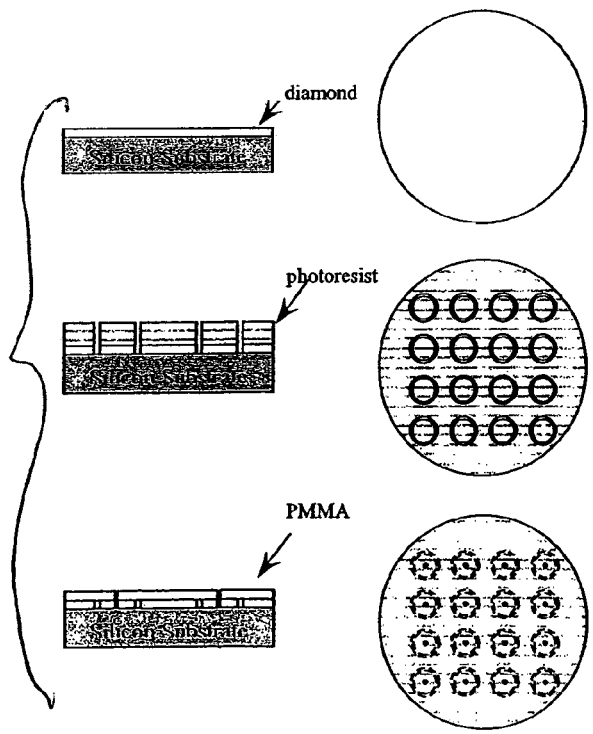
FIG. 5 is a drawing of the steps in a lithography process to fabricate the small diamond disks.

The exit hole from the plasma discharge chamber is fabricated by e-beam lithography by utilizing a JEOL 840 e-beam lithography system. The general lithographic procedures are as follows:

As shown in FIG. 5 diamond film is grown on a silicon substrate. Standard lithography techniques are used for patterning the diamond into disks of appropriate diameters (100's of microns to millimeter diameters). A dry etching process (reactive ion etch—RIE) is used to etch through the diamond layer. The photoresist is then be chemically removed and a PMMA photoresist is spun on for e-beam lithography. Small holes (50 nm-100's of nanometers) are defined at the center of each disk, using the JEOL 840 e-beam lithography system. The holes are etched through the center of each disk by, again, using the RIE process with an oxygen etching procedure. After the diamond layer has been patterned, the silicon substrate is removed by chemical etching (KOH etching). The free-standing diamond films in the shape of small disks (approximately 1 mm in diameter), are then be attached to the ends of small (1 mm OD) quartz tubes.

Figure 6:
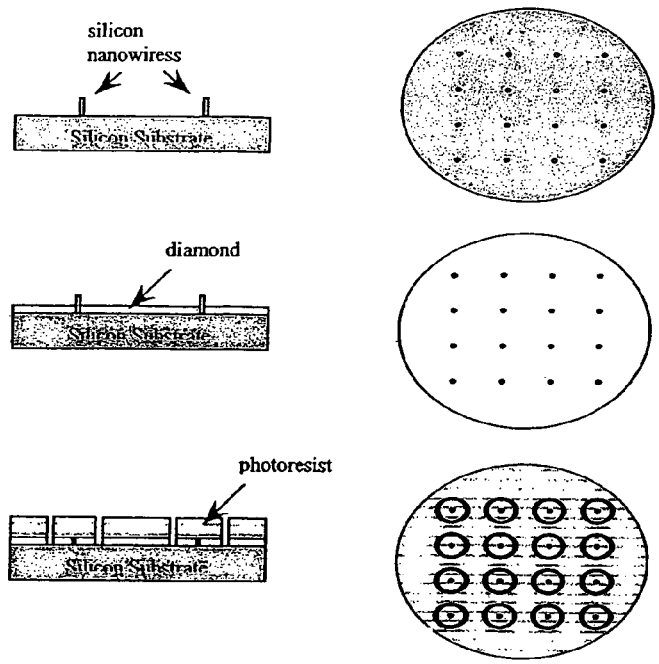
FIG. 6 as a drawing of the steps of an alternative process for fabrication of the small diamond disks.
Figure 7:
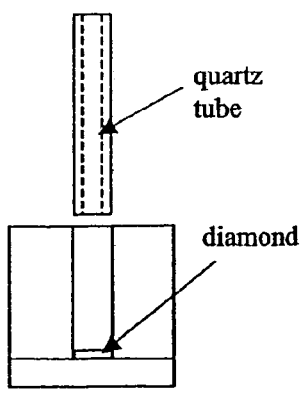
FIG. 7 is a schematic view of a Teflon assembly jig for alignment of quartz tube and diamond disk.

An alternative method of fabrication for possible simplification of the fabrication procedure, and extension of the capabilities to smaller dimensions as shown in FIG. 6. In this method, single gold nanoparticles that are commercially available are positioned on the surface of a silicon substrate using the AFM nanopositioning system. Nanowires are then grown up from the silicon (111) substrate [GIV00], from the site specific locations defined by the positions and size of the gold nanoparticles. After the growth of these nanowires, the diamond film is deposited followed by a brief polishing of the surface. The disks are then be defined by standard lithography techniques such as described in the second step shown in FIG. 5. The last step is to chemically remove of the silicon by etching away both the silicon substrate and the nanowires—leaving free standing small diamond disks with holes in the centers. This avoids the e-beam lithography step, and allows for dimensions of the center holes to be smaller than 50 nm as defined by the diameter of the grown silicon nanowires. The nanowires can be further thinned by repeated oxidization and chemical etching. The diamond disks are then coated with a tungsten metal film that is electrically biased and used to extract ions from the microplasma source as needed. To assemble the microplasma chamber, a 1 mm outside diameter quartz tube is coated on the end with a high temperature epoxy, and capped with a diamond disk that contains a small hole in the center. A simple Teflon alignment jig is used to center the diamond disk with the end of the quartz tube as shown in FIG. 7. The diamond disk is placed in the Teflon jig using a vacuum pickup tool.

Membranes have been made from nanocrystalline and ultrananocrystalline diamond films that show exceptional mechanical properties. In work by Sekaric et. al. "Nanomechanical resonant structures in nanocrystallin diamond", Appl. Phys. Lett, 81,4455-4457, 2002, continuous diamond films formed by nanocrystals have been formed with thicknesses as small as 80 nm. These films were used to fabricate structures with lateral dimensions as small as 50 nm. Diamond films grown with the smallest crystal sizes are ultrananocrystalline diamond films. These films have crystal sizes in the 5-10 nm range. These diamond films have very high elastic modulus of 900-1000 GPa and fracture stress of 1-4 GPa. Both nanocrystalline and ultrananocrystalline diamond films were investigated with similar modulus and fracture stress results. To put these results in context of this project, a one micrometer thick diamond film with a diameter of 2 mm can withstand a pressure differential across it of 5 atmospheres. Diamond also has properties of high dielectric breakdown strength, high thermal conductivity and resistance to chemical attack. All these properties are useful for a thin membrane that will be in a plasma environment.

Ion extraction grids are formed from end plate structures by coating the diamond membrane containing the aperture with a thin metal layer on one or both sides as shown in the lower right insert of FIG. 4. A metallic coating on one side forms a single grid ion extraction unit. The metallic coating will be electrically attached to a dc power supply. A return path for the current to the plasma is provided by placing another electrode within the plasma discharge at a location away from the extraction end. A double grid is formed by putting a metal film on both sides of the diamond dielectric membrane. Electrical connections are made to both sides of the dielectric membrane. Also single grid approach is used, which is also expected to give good results.

Figure 15:
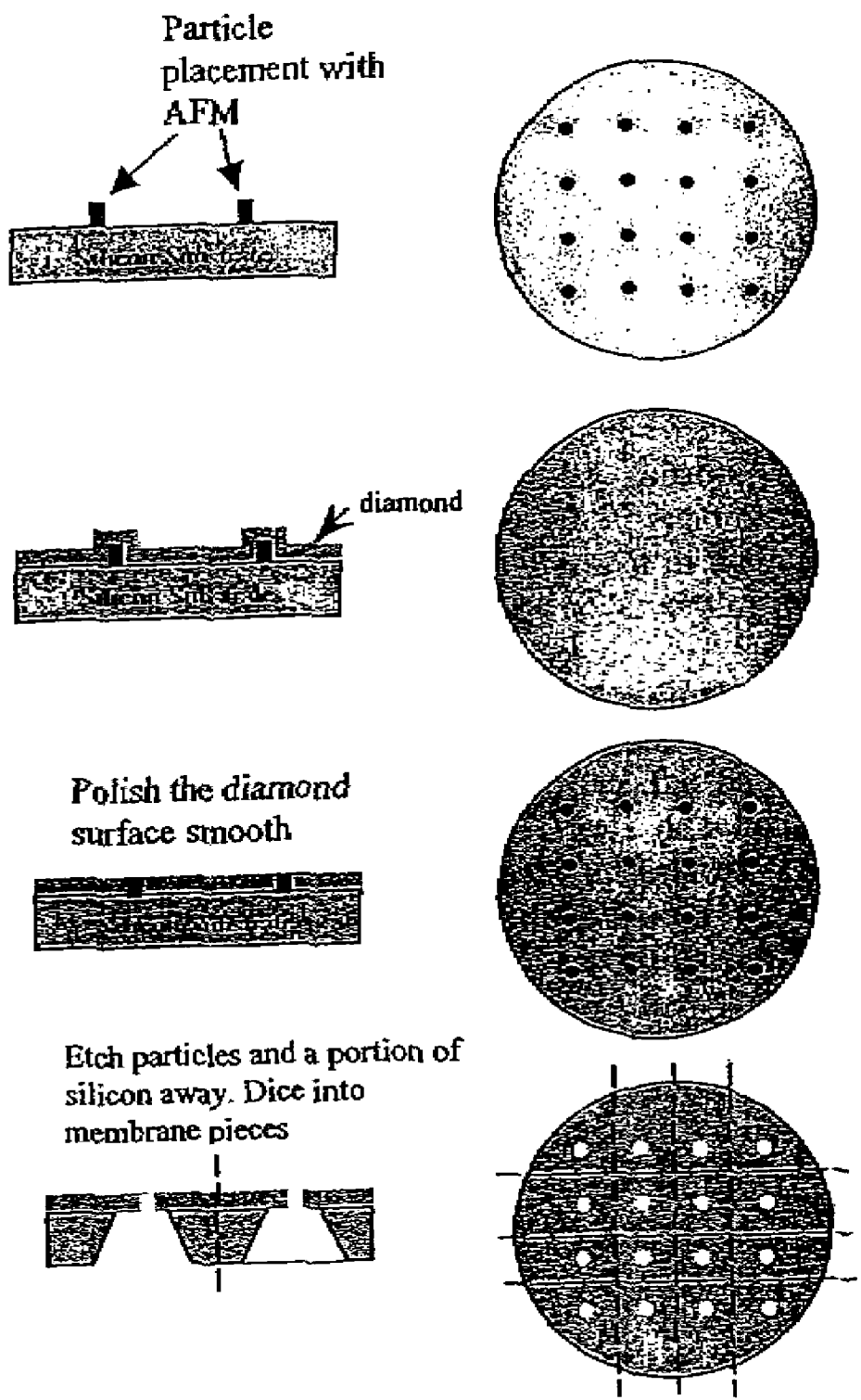
FIG. 15 is a illustration of the aperture fabrication process.

The alternative technique is shown in FIG. 15. Particles that are the size of the desired apertures are placed on a silicon wafer as described below. A thin layer of nanocrystalline or ultrananocrystalline diamond is grown on the silicon wafer to the desired thickness. During this growth process it is likely that the particles are overgrown with diamond. The diamond surface is then polished back enough to expose the sacrificial particle as shown in the third step in FIG. 15. Next the particles are etched out of the diamond film and the silicon is back etched to form the thin membranes that are on a silicon frame. The silicon frame is then be mounted on the end of the miniature plasma source. For making even smaller apertures than possible with particle placement, the apertures can be etched open and diamond grown to partially fill in the aperture to the desired size.

In the fabrication process of making the nano scale apertures as illustrated in FIG. 15, the key step is to precisely place the particles of size 10-100 nanometers on a silicon substrate. An atomic force microscopy (AFM) based robotic manipulation system is used for such nano patterning.

In the existing nano manipulation, an operation is designed offline based on the static AFM image and then downloaded to the AFM system to realize the operation in open loop. Whether the operation is successful or not has to be verified by a new image scan. Obviously, this scan-design-manipulation-scan cycle is very time-consuming because it usually takes several minutes to obtain a new AFM image. Combining the AFM with virtual reality interface and haptic devices, the tip-surface-object interaction can be felt. But the operator still cannot see real-time environment changing through the static virtual reality model. It becomes a major obstacle for an efficient nano manipulation, specially the complicated manipulation tasks such as assembly. Thus it is essential to develop an AFM imaging scheme which can update the image in real time.

The augmented reality system aims to provide the operator with real-time visual display. The real-time visual display is a dynamic AFM image of the operating environment. It is updated locally based on real-time force information obtained by the AFM tip. In this scheme, the AFM tip acts as a robot end effecter for manipulation, and a sensing device to obtain the interaction force between the tip and the environment. The force measurement provides the necessary information to update the AFM image locally to obtain a real-time AFM image. As show in FIG. 8, the real-time AFM image significantly improves the efficiency of a manipulation. A manipulation of ten's nano particles can take several weeks to finish using scan-design-manipulation-scan scheme. But it only took about two (2) hours to assemble the pattern shown in FIG. 8, which consists of hundred's nano particles.

There are difficulties in obtaining the force signals and calculating the real environment changes. Due to the reflection of sample surface and bow effect of the piezo tube, the force signal is convoluted with a lot of false signals and noise. The strong cross-talk from normal to lateral direction makes it difficult to measure the lateral force. The tip displacement due to the deformation of cantilever makes the control of the tip position, especially in lateral direction, difficult. Another challenge is to develop a mathematical model to calculate the real-time objects movements.

In order to obtain the high fidelity force measurement, an algorithm for force signal compensation is used. A position control algorithm is also developed in order to display the accurate tip position during manipulation. In addition, a 2-D image background with accurate lateral position information is very helpful to the operator during nanomanipulation. Instead of using 3-D graphics that is difficult to obtain in real-time, a 2-D image with height information encoded in color directly from AFM is used as the background for graphic display in the augmented reality environment. The height information of cantilever tip is also represented by color contrast, so the operator still can visualize the 3-D information of the operating environment. In order to display the real-time changing of the AFM image in the augmented environment, a tip-substrate-object interaction model is developed to provide necessary force information to locally update the AFM image.

Furthermore, due to the thermal drift, the position of particles shown in a AFM image can be different with its true physical position during manipulation. The newly scanned image area has a smaller thermal drift than the past scanned area, therefore, different particles in the same AFM image may have different thermal drift. It becomes hard to make any thermal drift compensation. In addition, the particle may be lost in the middle of an operation. It is important to develop a "re-positioning" and "lost and found" techniques to solve all these problems.

Before pushing each single particle, the tip will go to the original position of that particle shown in the AFM image, and take a local scanning around the neighbor area of that particle. The real-time physical position of that particle can be obtained by analyzing the scanning image. Once the new particle position is obtained, a small adjustment of the designed path is made automatically by the augmented reality system. During pushing, the tip may follow a new path that has a small offset with the original starting point. This process is called "re-positioning".

During the pushing, the particle can be lost in the midway of the path. The losing of the particle can be detected by observing the force information based on the force model developed in this proposed project. Once the augmented reality system detects that the particle loss, the tip will go back to the losing point and make a local scanning around the neighborhood area of the losing point. Using the same technique as the "re-positioning", the lost particle position can be found and a path adjustment is performed to continue the operation.

The tip displacement due to the deformation of cantilever makes the control of the tip position, especially in lateral direction, extremely difficult since the position measurement of the tip in lateral direction is made at the other end of the cantilever. As show in the FIG. 21, the deformation of the cantilever contributes to the position error of the tip position, which will be in the range of 10-50 nano meters.

An active controlled cantilever is used to overcome this problem. As shown in FIG. 16, an active controlled cantilever has a layer of piezo electrical material on it bottom surface. Based the signal in the photo signal detectors, the deformation of the cantilever can be measured. An active controller is designed to generate proper actuation command to balance the deformation force. As a result, the cantilever maintains the original configuration as if it is a rigid structure. The preliminary study has shown the active control can significantly reduce the position error caused by the deformation of the cantilever.

As shown in FIG. 16, the configuration of the cantilever maintains the original shape during a manipulation. Therefore the effect of the deflection on the position error can be significantly reduced. It makes it possible to manipulate the nano particles in a 10-50 nano meters range.

The adhesion force existing on the AFM tip surface can easily pick up the nano particles if its size is less than 50 nanometers. It makes the patterning very difficult since the intended operation is to just push the particles on the surface. A direct coating method is used to reduce the tip surface adhesion force. The direct coating method is based on silanizing a solid surface with 3-aminopropylmethyl-diethoxysilane (APrMDEOS) (Sigma-Aldrich Co.), which protonates at neutral pH. The silane group in APrMDEOS is highly reactive and silanizes the surface by forming covalent bonds with surface atoms. Briefly, the silicon nitride tips were treated with 10% nitric acid solution which was left in a silicone bath for 20 min at 80° C. This causes the formation of surface hydroxyl groups on the SiN tips. The tips were then thoroughly rinsed with distilled water and placed into 2% APrMDEOS solution in toluene. Lastly, they were kept in a desiccator purged with argon gas for 5-10 hours. The preliminary results have shown after the above treatment, the surface adhesion force on a AFM tip can be significantly reduced. As a result, the adhesion force on the AFM tip surface is much less than the substrate surface. It makes it easier to pattern the nano particles, especially the small size particles.

The nano manufacturing workcell consists of tool set, motion stage, and computer control system. The tool set includes the plasma-assisted tool, multiple AFM tip holders and gas nozzle. The AFM tip holders have the tips with different functionalities, such as imaging, manipulation and cutting. The motion stage is used to hold the substrate for manufacturing and is driven by two actuation systems, fine motion and coarse motion. It has total 9 degrees of freedom (DOF). High precision servomotors generate the coarse motion. It has total 6 DOF, X, Y, Z linear motion and 3 rotations. Piezoelectric actuators generate the fine motion. It has total 3 DOF, X, Y, Z linear motion. The loading and unloading the parts and tool selections are realized by coarse motion of the stage. The fine motion is used for the manufacturing processes. Based on a given task, different tools can be engaged individually. The parts and components in the workcell can be allocated by optical microscope and AFM images. The multiresolution landmark scheme is used to calibrate the system, allocate specific features and position tools. The computer control system provides a user interface, and simulation environment.

Figure 9:
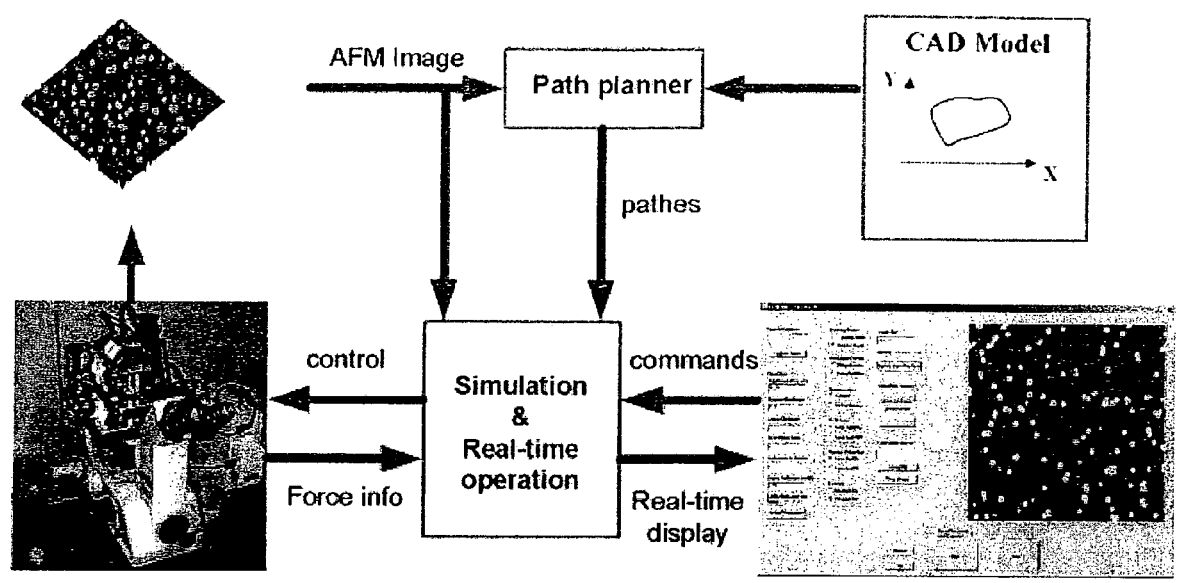
FIG. 9 is a schematic view of a computer aided design (CAD) guided nano-manufacturing workcell.

An operation of the nanomanufacturing workcell requires the generation of tool paths based on a given CAD model to perform fabrication and assembly of nano parts or nano devices. FIG. 9 shows the operation of nano manufacturing workcell.

First, based on the CAD model of a nano part or nano device and the environment model obtained by an AFM scan, a manufacturing plan is generated. It can include multiple sequences of processes, and require using different tools. An operator can either realize the processes manually with the assistant of augmented reality system, or automatically with the computer control. For automated processes, collision-free tool paths are generated based on the given manufacturing plan. The path can be used to remove or add material to the surface, or manipulate parts for assembly. The paths can then be input to the simulation environment to check if there are any collisions. Then the path is implemented to perform the actual manufacturing process. During nanomanipulation, the process and environment can be observed in real-time using the augmented reality system.

Operations to be Performed

First, based on the task requirements and the environment model, the given CAD model is decomposed for individual sub processes. The methodologies, then, are provided to automatically generate the collision-free AFM paths for sub processes, which can includes adding/removing material, and assembly components. Finally, a simulation platform is also be developed to on-line verify the paths and the manufacturing processes.

Demonstrated Use of the Micro-Plasma Source

Fabrication and assembly of an optical detector. The assembly process takes a top-down approach that consists of the following steps:
1. Fabricate a micro-plasma source as described above.
2. Integration of the micro-plasma sources into a nanomanipulation system
3. Deposit diamond films on commercially available AFM tips.
4. Utilize this micro-plasma source to shape the diamond coated AFM tips to the desired aspect ratio and structure.
5. Use the diamond coated AFM tip in the nanomanipulation system to scratch locations on a glass substrate (or SiO2 coated silicon substrate).
6. Fabricate CdS nanowires through the vapor-liquid-solid technique. Wires are removed from the substrate and placed in solution by sonication.
7. Manipulation of the nanowires on the substrate to place the nanowires into the scratch locations.
8. Use of the micro-plasma source to deposit metal electrodes at the ends of each nanowire followed by an annealing step to make low resistance contacts to the nanowires.
9. Fabricate a free standing diamond film of optical quality.
10. Use of the micro-plasma source to etch the diamond film and shape it into a micro lens array.
11. Assemble the diamond micro lens array onto the array of nanowires for an integrated optical detector.

The goal in assembling this optical detector is to demonstrate the use of the plasma sources for deposition of materials and for etching of 3D structures (the micro lens array).

Figure 10:
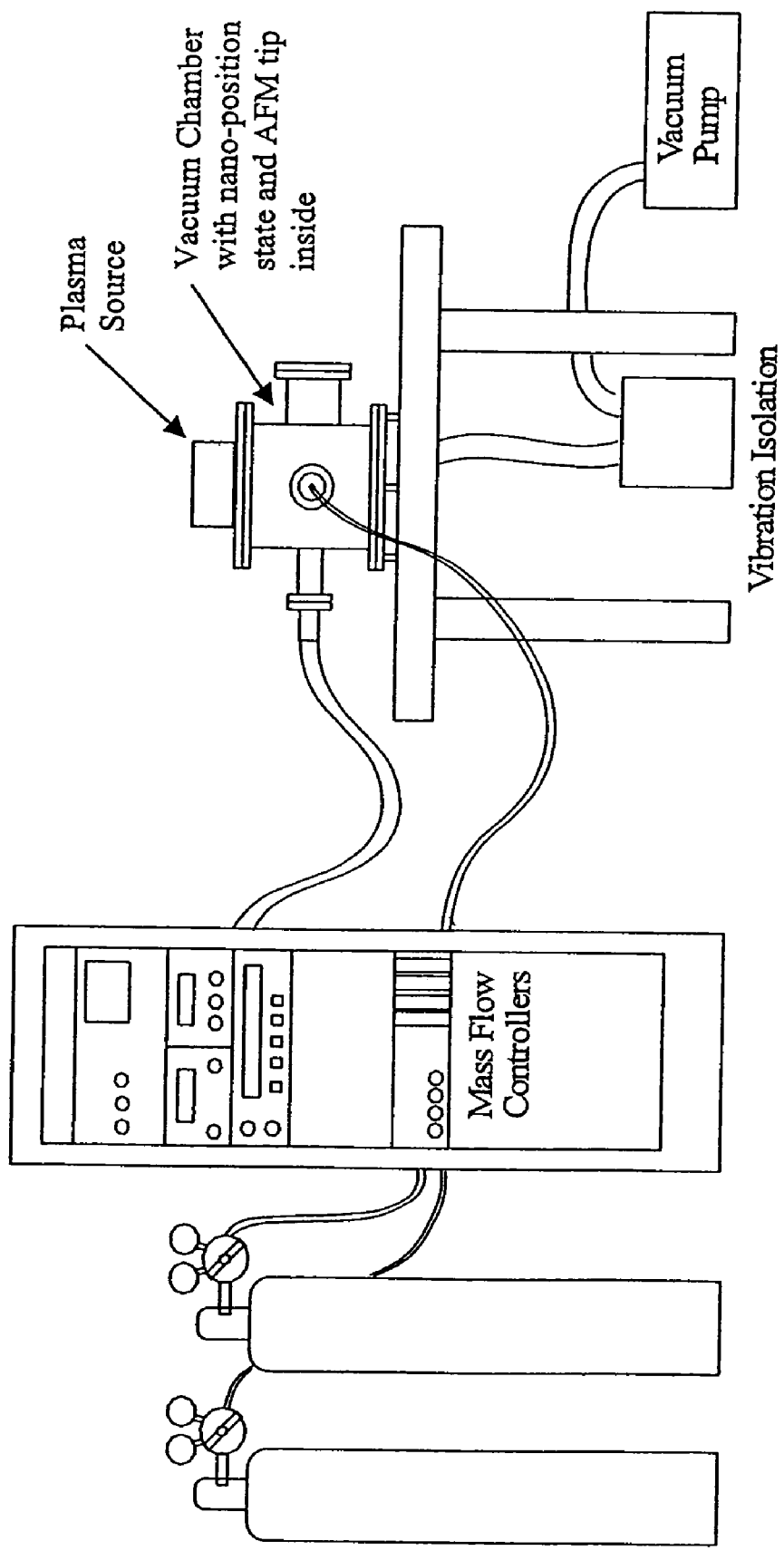
FIG. 10 is a drawing of a deposition/etching system that incorporates a nanomanipulation x-y-z stage.

The entire nanomanipulation system is shown schematically in FIG. 10, where the gasses necessary for either etching or deposition are supplied to the vacuum chamber and controlled through mass flow controllers.

Figure 11:
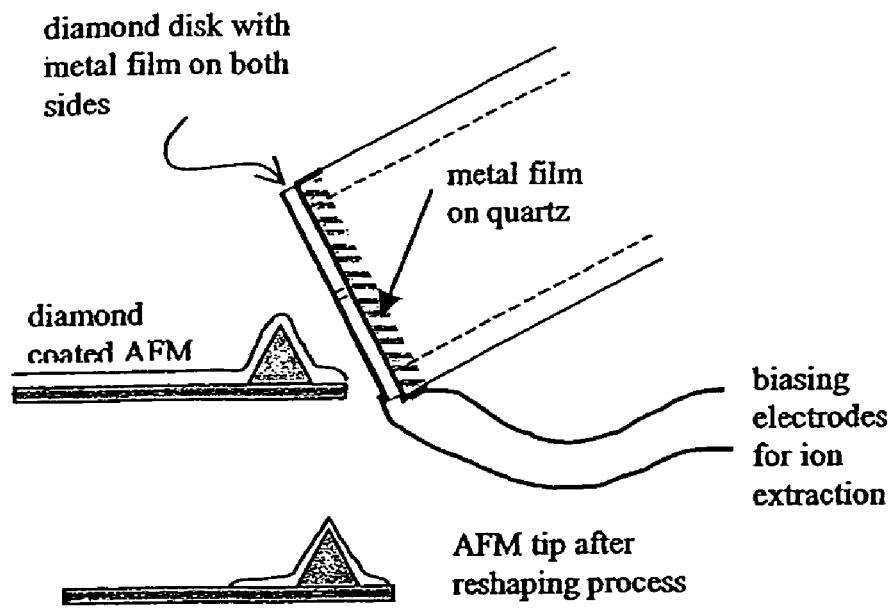
FIG. 11 is schematic showing the use of the micro-plasma source for diamond film etching.

Diamond is locally etched by using the micro-plasma source as an ion source in the presence of an oxygen background gas. In this way, diamond coated AFM tips are reshaped as shown in FIG. 11 to the desired tip sharpness, and cantilever coverage. More complex structures are also possible with this technique, such as plate-like tips, or ball shaped tips.

The vapor-liquid-solid (VLS) technique utilizes a catalyst that forms an alloy with the material being deposited. As an example, consider the deposition of silicon by the VLS technique utilizing gold as the catalyst. The Au—Si phase diagram indicates that at 800° C., as the silicon concentration rises above approximately 35 atomic %, the silicon drops out as a solid while the gold alloy will remain a liquid. At high temperatures, the sticking coefficient for the liquid surface is much higher than for the surrounding solid surface. Thus for the alloy in the form of a droplet, a wire would be grown since the liquid droplet would define the cross section of the deposited material. As the silicon drops out as a solid, the liquid droplet is pushed up always riding on top of the solid deposited.

The catalyst (Au in this example) thus assembles the depositing silicon into a geometry defined by the droplet. By controlling the size and location of the gold droplets on the surface of a substrate, it is possible to control the size (3 nm to 0.2 mm have been reported and location of wire growth.

Figure 12:
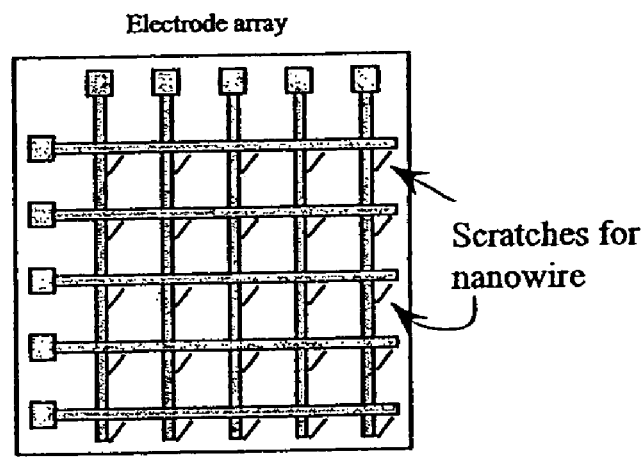
FIG. 12 is a schematic view of an electrode array. Vertical and horizontal electrodes are electrically isolated by an oxide film so each nanowire can be electrically addressed.

A substrate is prepared with an array of electrodes as shown in FIG. 12 and scratches in the oxide layer is be made to help position the nanowires. A solution containing nanowires is then poured onto the electrode array, and the AFM nanopositioning system is used to push the nanowires into the scratches.

The micro-plasma source is then used to form electrical contacts between the nanowires and the corresponding electrodes, but utilizing the appropriate background gas while providing an ion source from the microplasma.

A microlens array is then be formed in a free standing diamond film by reshaping the surface of the diamond in the same manner as was done for the diamond coated AFM tips (see FIG. 5). The microlens array is fabricated so as to concentrate light onto each of the nanowire locations depicted in FIG. 12. This helps to further increase the sensitivity of optical detection through a change in resistance of the nanowires through photoexcitation of electron hole pairs in CdS (a common material used for photodetectors).

This integrated optical detection system demonstrates the deposition, and etching capabilities of the micro-plasma source, both for planar and for three-dimensional surfaces (lenses).

The objective of this aspect of the invention is to provide processes and related equipment for adding/removing materials in the nano environment. To address the need for new manufacturing processes that add and remove material at the nanoscale this invention provides a plasma-assisted workcell capable of localized surface modification, including etching and deposition, preferably with processing areas of less than 50 nanometers in diameter. In particular this invention provides plasma sources that operate at the nanoscale, integrated into nano-manufacturing workcells similar to that shown in FIG. 13. Very small plasma, free radical and ion technologies are disclosed.

Figure 13:
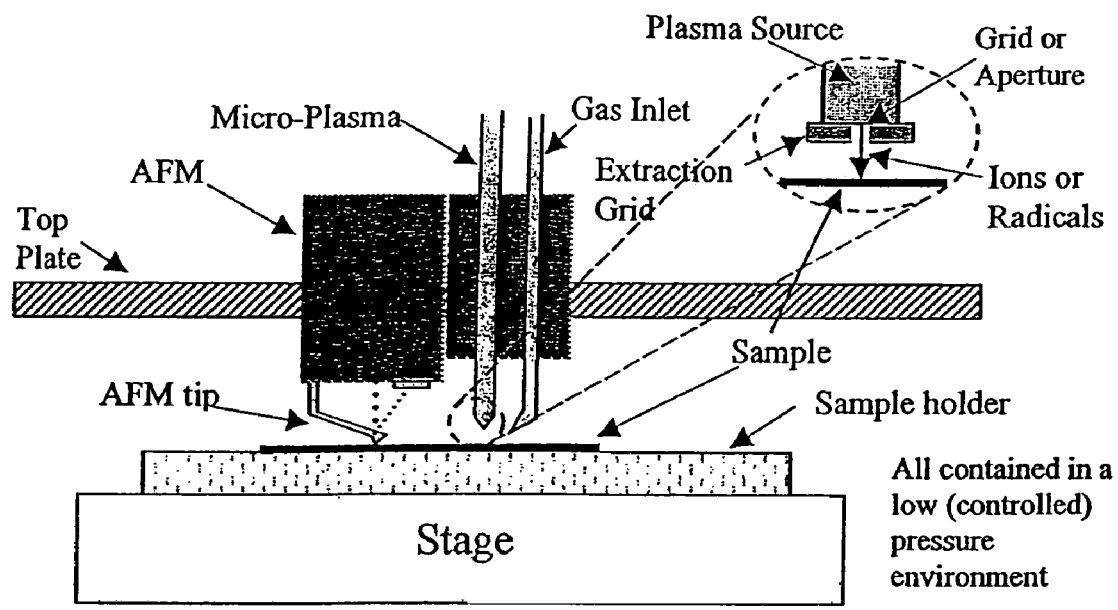
FIG. 13 is a schematic view of an integrated nano-manufacturing workcell or work region.

This invention provides new plasma-assisted manufacturing processes and associated machines at the microscale. A micro plasma source technology is combined with state-of-the-art robotic controls and know-how to create new micro-manufacturing technologies and associated processes. The resulting machines are identified as plasma-assisted micro-manufacturing workcells. As shown in FIG. 13 the micro-manufacturing workcell consists of a tool set, motion stage, and a computer control system. The tool set includes one or more plasma-assisted tools, Atomic Force Microscopy (AFM) tip holders and an optional gas nozzle. This plasma-assisted workcell is capable of localized, i.e. on the micron sized level, surface modification, including etching and film deposition. In addition, the workcell is also able to provide AFM based visual inspection of the surface(s) between processing sequences. These inspections serve as a method of monitoring the shaping during the micro-manufacturing and enable the assessment of the manufacturing process itself.

Recently developed mini-micro plasma source technology U.S. application Ser. No. 60/560,145 filed Apr. 7, 2004, now U.S. patent application Ser. No. 11/100,253, filed Apr. 6, 2005, and know-how in robotic controls to the development of a new plasma assisted, micro-manufacturing workcell and associated new process techniques. New micromanufacturing technology has tested in the laboratory by experimentally evaluating the feasibility using simple prototype designs (see FIG. 14).

Challenges associated with the invention involve the design and evaluation of the plasma sources, and then the integration of these sources into an operational workcell. The plasma sources are very small, i.e. of less than millimeter size, and must have nanoscale apertures and extraction grids. Additionally, the plasma sources are designed and packaged into the workcell to enable the positioning and processing with nanoscale precision. Scale down of the plasma source technology is not a simple extension of design and fabrication methods that are being developed for the above mentioned micro-manufacturing work cell, but require entirely new designs and fabrication approaches as set forth herein, such as the fabrication of nanometer sized apertures and grids on thin submicron thick dielectric membranes and then attaching them onto or integrating them into the plasma source itself.

The unique feature of the plasma-assisted nanomanufacturing workcell is the incorporation of plasma processing sources that are capable of producing a controllable, low energy and selective nanoscale beam of ions and free radicals. The source can have a processing area of less than 100 nanometers in diameter, preferably with 10 nanometers in diameter. The beam of ions or free radicals is created by placing a membrane, which has a small aperture in it, on the end of a micro-plasma source. The beam is formed when the free radicals stream through the aperture or ions are extracted through the aperture by a set of voltage biased grids. The beam source is position controlled with nanometer resolution. Thus the source can be precisely positioned and manipulated for processing requirements. The type of processing that can be done with such a source includes surface activation, etching, ion milling/sputtering, and plasma-assisted deposition processes. Because of the ability to produce free radicals, interesting surface and deposition processes is achieved with nanometer resolution. Four technical aspects of this workcell are: (1) creation of an aperture in a membrane that is sized 10-100 nm in diameter such that the aperture has an aspect ratio near unity (diameter~depth), (2) creation of conducting plates/surfaces on one or both sides of the thin membrane containing the aperture, (3) design of an overall ion and radical beam workcell that can position the membrane aperture very close to the substrate and (4) integrating the plasma-assisted workcell with an AFM based robotic system that enables nanoscale positioning and materials processing.

The broad impact of this invention is that the workcell opens up new ways to fabricate 2-D and 3-D structures by using nanoscale surface treatments including etching, deposition and surface functionalization by plasma treatments. An extension of this invention is that once a single nanoscale plasma source is understood and characterized, an array of these sources can be developed to perform direct ion beam processing and plasma assisted etching or deposition without lithography steps. The plasma sources can be turned-on and turned-off as the piece being processed is scanned. This lithography free approach is especially attractive when the device being fabricated requires 10's to 100's of different lithography steps to implement, which is the number of processing steps that are envisioned for many nano devices and sensors constructed from a variety of materials.

Figure 8:
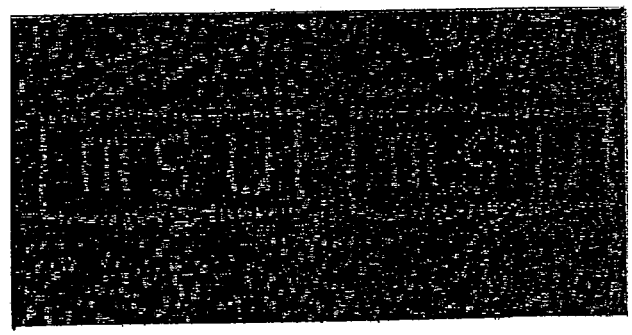
FIG. 8 is a photograph of an assembly of nano particles with 100 nm size.

The augmented reality system aims to provide the operator with real-time visual display. The real-time visual display is a dynamic AFM image of the operating environment. It is updated locally based on real-time force information obtained by the AFM tip. In this scheme, the AFM tip acts as a robot end effecter for manipulation, and a sensing device to obtain the interaction force between the tip and the environment. The force measurement provides the necessary information to update the AFM image locally to obtain a real-time AFM image. As shown in FIG. 8, the real-time AFM image can significantly improve the efficiency of a manipulation. A manipulation of ten's nano particles can take several weeks to finish using scan-design-manipulation-scan scheme. But it only took a couple of hours to assemble the pattern shown in FIG. 8, which consists of hundred's of nano particles.

However, it is not so easy to implement the augmented reality system, especially to extend its capability to manipulate the objects in the range of 10-50 nanometers. The major difficulties include the requirement of the high accuracy of the position control, and overcoming the adhesion force on the AFM tip surface.

Computer Integrated Nano-Manufacturing Workcell

Figures 14A, 14B:
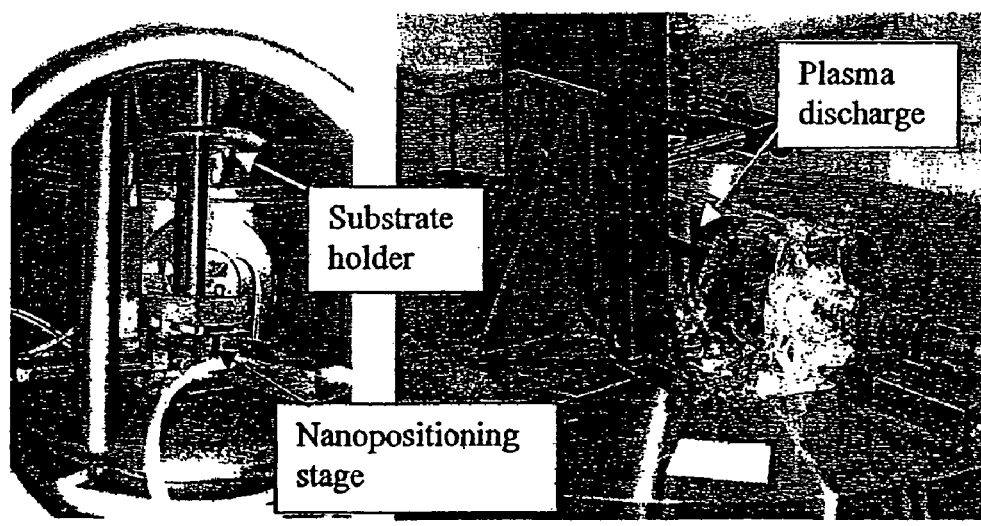
FIGS. 14A and 14B are photographs of a prototype of the micro/nano manufacturing workcell. Left photo-inside chamber and right-plasma source.

A computer integrated nano-manufacturing workcell is used that incorporates an AFM system, a plasma source(s) and an additional, optional gas feed source. As shown in FIG. 13, the nanomanufacturing workcell consists of a tool set, motion stage, and computer control system. The tool set includes one or more plasma-assisted tools, Atomic Force Microscopy (AFM) tip holders and optional gas nozzle. The AFM tip holder will have a tip with specific functionalities, such as imaging or manipulation or both. Or, if necessary, two AFM tip holders-one for imaging and one for manipulation. The integrated system provides the capabilities of AFM imaging, and AFM based manipulation and a variety of plasma source processing. The motion stage is used to hold the substrate for manufacturing and is driven by two actuation systems, i.e., fine motion and coarse motion. High precision servomotors generate the coarse motion. Piezoelectric actuators generate the fine motion. The loading and unloading of the parts and tool selections is realized by coarse motion of the stage. The fine motion is used for the manufacturing processes. Based on a given task, different tools are engaged individually. The uniqueness of this workcell is adding plasma source capabilities to AFM imaging and manipulation capabilities. This adds a greater variety of surface treatments to the nano-manufacturing workcell, in particular, the plasma source adds the ability to treat localized surface regions with low energy ions and reactive neutral radicals. Once the surface is treated the traditional AFM capabilities of imaging is employed to understand the various surface treatments. In addition, AFM manipulation is used to bring other particles or micro-parts to the surface treated regions. This system is also used to form functional layers for joining various materials. This workcell is shown in FIG. 14, which shows a nanopositioning stage and plasma source.

The nano-manufacturing machine is a multi-process workcell. It deposits and etches material, as well as moves objects around on the substrate and images the surface to understand and inspect how each process has been performed. In order to achieve this the AFM system must be computer-controlled as part on an integrated system to efficiently perform the manufacturing tasks. Thus part of the proposed work is the development of the controls. An example is the AFM based controls for a manipulation system which is described in detail below. This control system also incorporates plasma sources.

The work on manipulation that uses an augmented reality system is extended to the plasma sources that remove and add material. The AFM system is used to initially image all or a portion of the workpiece. Then the plasma-assisted process is preformed on all or a portion of the workpiece. By developing empirical models based on experimental experience for the material removal or addition process, an initial image of the result is formulated and the AFM system is used to check the result. With a well developed model the desired processing result can be achieved with minimal postprocessing AFM imaging time. The augmented reality system that has appropriate features for both manipulation and plasma-assisted material removal and addition is important for efficient nanomanufacturing.

In the computer integrated nano manufacturing workcell, the parts and components can all be located by optical microscope and AFM images. The multi-resolution landmark scheme is used to calibrate the system, allocate specific features and position tools. The computer control system provides a user interface, and simulation environment.

An operation of the nano-manufacturing workcell requires the generation of tool paths based on a given CAD model to perform processing and fabrication of nanoscale surfaces or devices. First, based on the CAD model of a part or device and the environment model obtained by an AFM scan, a manufacturing plan is generated. It can include multiple sequences of processes, and require using different tools. An operator can either realize the processes manually with the assistant of augmented reality system, or automatically with the computer control. For automated processes, collision-free tool paths are generated based on the given manufacturing plan. The path can be used to remove or add material to the surface, or manipulate parts for assembly. The paths can then be input to the simulation environment to check if there are any collisions. Then the path is implemented to perform the actual manufacturing process. During manipulation, the process and environment are observed in real-time using the augmented reality system.

The following scenarios are used to test and evaluate the nano manufacturing workcell. (1) Nano lithography: the nano plasma source is used to generate pattern on a substrate surface by removing (etching) the material. The feature size is dependent on the size of the aperture of the plasma source. It can range from 10 to above 50 nanometers. The results of the process are first measured by the AFM integrated in the system. The substrate is then be removed from the workcell and is further evaluated by a commercial AFM. The results are compared to show the accuracy of the integrated AFM and quality of the manufacturing process. (2) Nano additive manufacturing: a plasma induced material growing on a substrate are performed. First a structure to be deposited is designed and simulated using the integrated CAD design and simulation tools developed for the nano-manufacturing workcell. Based on the design, a process plan and control command is generated. By controlling the motion of the substrate generated by the computer controlled stage, material grows in a specific way to form the desired structure. The deposited structure is measured by the integrated AFM system. The results are compared with the images of a commercial AFM and SEM to evaluate the dimensionality and accuracy of the structure.

The specific demonstrations of the present invention include 1) etching of nanoscale holes and lines in silicon using SF6/Argon plasma discharge mixtures, 2) deposition of silicon dioxide by using a separate TEOS gas feed and a noble gas ion beam to activate the deposition by energetic particles, and 3) deposition of amorphous carbon (diamond like carbon) by ion beams created from an acetylene discharge.

A specific example of this is the assembly of MEMS-based microsystems where very different materials and fabrication processes are involved for systems that integrate electronic, fluidic, chemical/biological sensing and mechanical subsystems. Such systems utilize multiple materials including semiconductors, ceramics, metals, polymers, bio-materials, and active materials. To fabricate and assemble such Microsystems requires developing new manufacturing processes that combine both continuous and discrete manufacturing processes and allows the integration of both top-down and bottom-up approaches. Thus advancement of the state-of-the-art of micromanufacturing technology is especially needed for three-dimensional Microsystems. In essence, the research and development in assembly and packaging of Microsystems needs further innovation.

To address the need of new micro-manufacturing processes this invention provides a computer directed, micro plasma-assisted processing system capable of localized surface modification, including etching and deposition. The invention provides a mini/micro plasma sources and robotic controls to plasma-assisted micro-manufacturing machines and associated processes. Mini/micro plasma source is combined with state-of-art robotic controls and know-how to integrate the plasma-assisted tools into the manufacturing workcell. This workcell preferably includes an AFM based robotic tool that not only directly monitors the process but also adds process features such as assembly of materials/parts. The various workcell processes/tools, i.e. adding, removal and functionalizing of materials and assembly of materials, take place within surface regions and features sizes down to one micrometer. In particular, the integrated manufacturing workcell is capable of machining and assembling micron-size three-dimensional structures, devices, and systems. In addition, the workcell is also be able to provide AFM based visual inspection of the surface(s) between processing sequences. These inspections serve as a method of monitoring the shaping and assembly during micromanufacturing and enable the assessment of the manufacturing process itself.

The unique feature of this plasma-assisted manufacturing workcell is the incorporation of several micro plasma processing sources that are capable of producing a controllable, low energy and selective microscale beam of ions, free radicals or UV photons. Each individual source has a processing area that can be as small as one micron square. The sources are position controlled with submicron resolution. Thus each source is precisely positioned and manipulated for processing requirements. The type of processing that is done with such sources includes surface activation, etching, ion milling/sputtering, plasma-assisted deposition and UV light activation of surfaces and processes. Because of the ability to produce free radicals, interesting surface processing and deposition processes can be achieved with micron resolution and possibly submicron resolution. The integration of the plasma-assisted tool with the AFM based robotic system provides the micro-manufacturing workcell with the capability of positioning, and manipulating the components and parts, as well as the tools with submicron accuracy.

The present invention provides a computer directed, micro-manufacturing plasma-assisted tool for micron scale material processing; the development of AFM based robotic tool for manipulation of components and parts; and the integration of the plasma-assisted tool with the AFM based robotic device to form an automated micro-manufacturing workcell.

Figure 19:
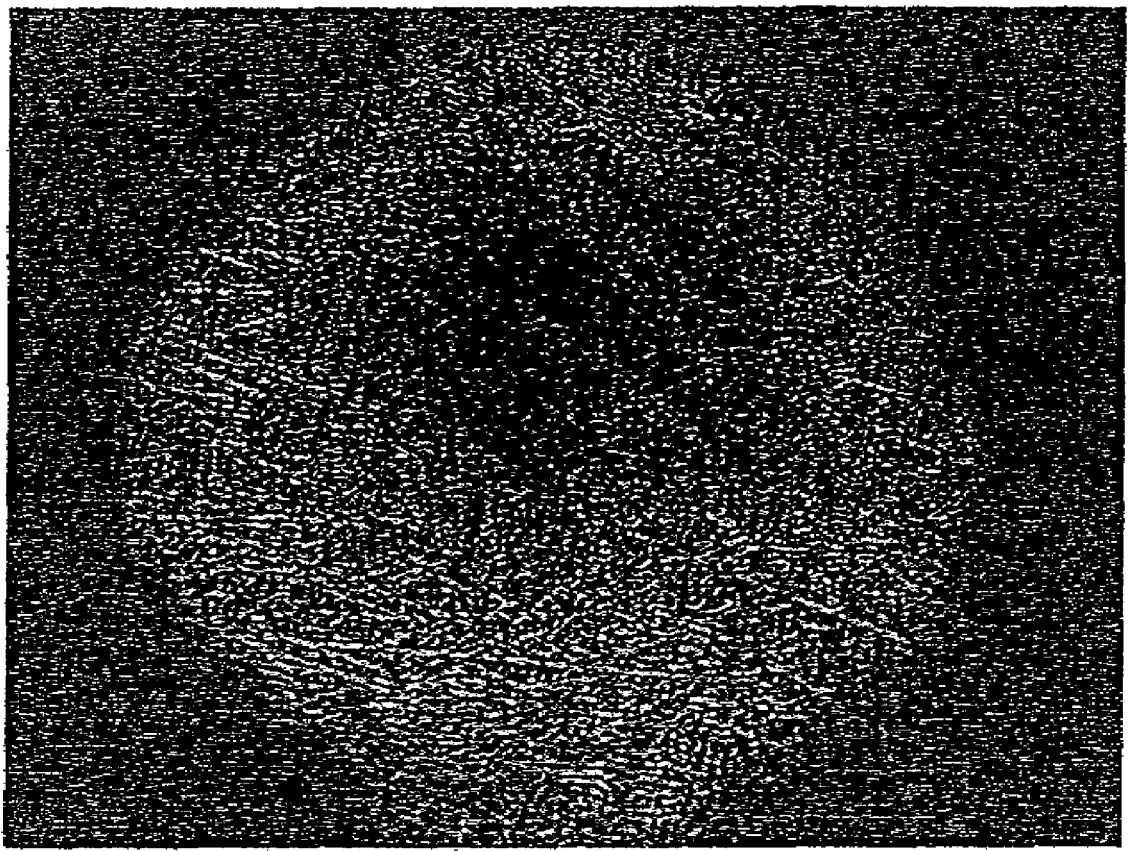
FIG. 19 is a SEM image of an opening which has been etched into a Si wafer.

FIG. 19 shows an image of a plasma etched opening in a silicon wafer by the process of the present invention. The diameter is 1.5 mm and the depth is 2μ/The operating parameters of the plasma source which was as described in U.S. Pat. No. 6,759,808 to Grotjohn et al were $P_{inc}$: 50 Watts
Ar: 30 sccm, $SF_6$: 0.5 sccm
Tube size: 1 mm i.d.
Pressure: 1 Torr
Duration: 5 min
Result
Diameter: 1.5 mm
Depth: 2 μm FIG. 20 shows the materials processing system of FIG. 10 which was used to process the surface of a silicon wafer of FIG. 19. The plasma source utilized-had a 1 mm i.d. tube in which the plasma discharge was created using microstripline application of FIG. 1. The plasma streamed out of the plasma source onto a silicon wafer placed on the substrate holder stage. The result of the interaction of the plasma with the substrate is shown in FIG. 19. The processing conditions included an argon flow rate of 30 sccm, a sulfur hexafluoride flow rate of 0.5 sccm, an incident microwave power of 50 watts, a chamber pressure of 1 Torr and a processing time of 5 minutes. The result as shown in the figure was a hole in the silicon wafer that was 1.5 mm in diameter and approximately 2 microns deep.

Figure 21:
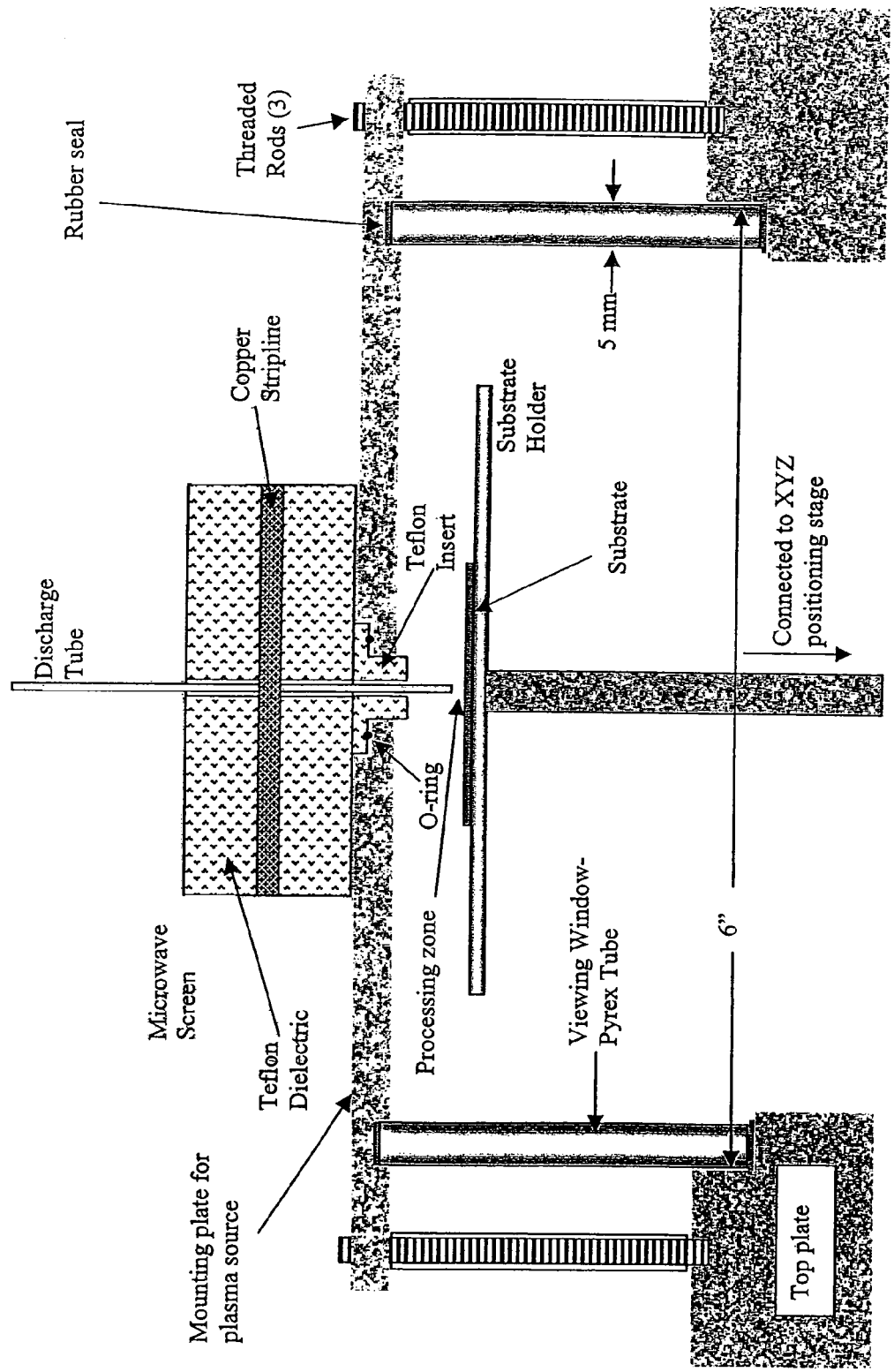
FIG. 21 is a drawing of a vertical or longitudinal axis cross-section of the chamber of FIG. 10.
Figure 22:
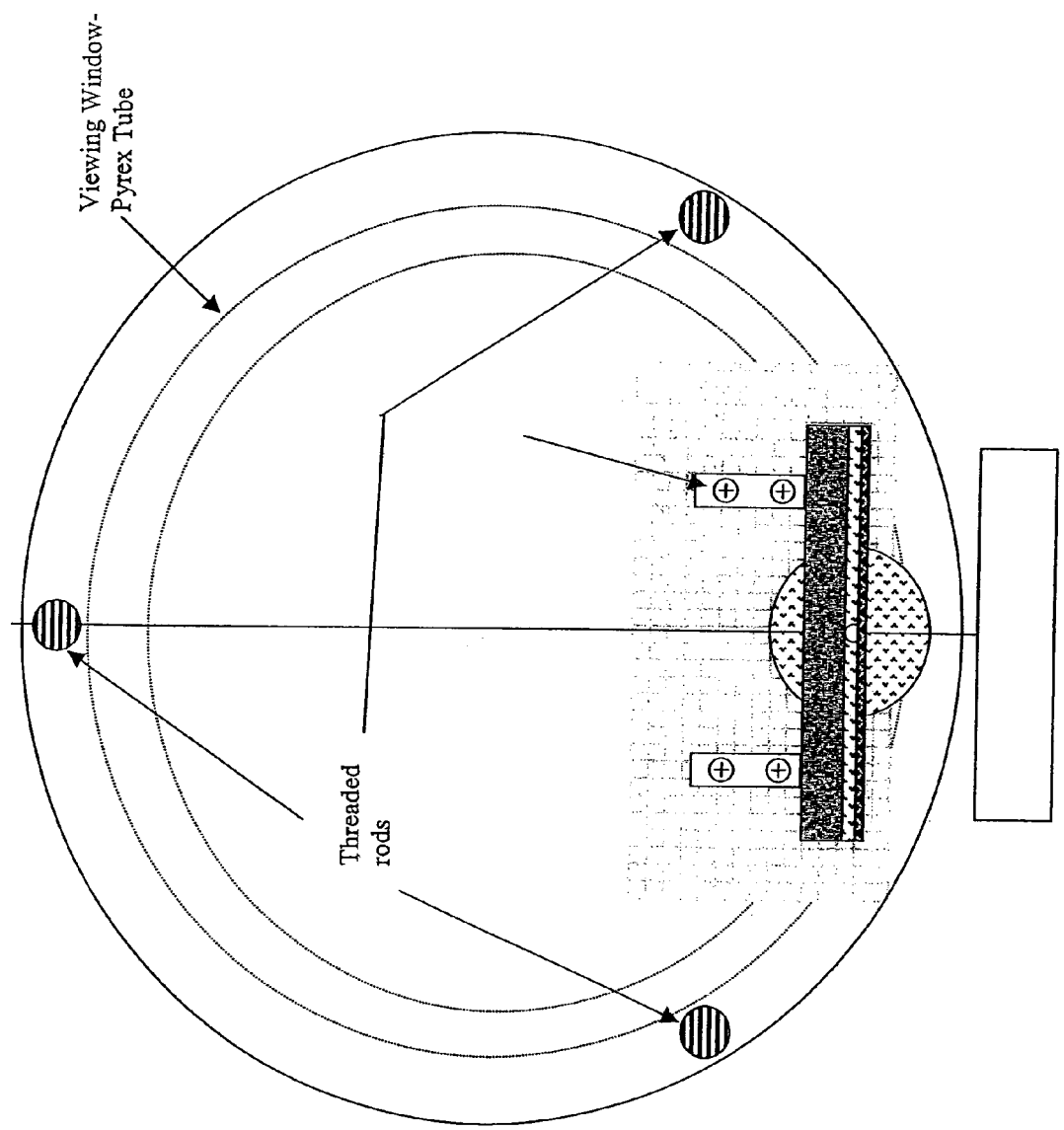
FIG. 22 is a horizontal cross-section of the chamber perpendicular to the longitudinal axis of FIG. 21.

FIGS. 21 and 22 are cross-sectional views of the apparatus of FIGS. 10 and 20. FIG. 10 shows the plasma source mounted on a vacuum chamber. The vacuum chamber is mounted on a vibration isolation table. Inside the vacuum chamber the nano-positioning stage is placed. Also mounted inside the chamber is the AFM. The plasma source unit is located on top of the vacuum chamber. FIG. 21 shows a cross section of the plasma source. As shown in FIG. 21 the plasma source is attached to a mounting plate. In a hole located on the mounting plate a Teflon insert is placed through which the discharge tube extends. The discharge inside the discharge tube is created using a microstripline structure. The microstripline structure is attached to the mounting plate as shown in FIG. 22. To provide optical access to see the processing region from the side, a Pyrex tube of 6 inch OD is used. The mounting plate is held in position on top of the Pyrex tube by using three threaded rods. Also indicated in FIG. 21 is the processing zone where the plasma stream interacts with the surface.

It is intended that the foregoing description be only illustrative of the present invention and that the present invention be limited only by the hereinafter appended claims.

We claim:

1. A process for manufacturing changes of a substrate which comprises:
   (a) providing a substrate with a surface on a stage which provides a 100×100×100 microns or smaller work region which allows positionally accurate three dimensional movements in a work environment; and
   (b) impinging beams of matter or radiation from an adjacent plasma source having a beam with a cross-sectional width of 100 microns or less into the work region to modify the surface of the substrate in at least one dimension.

2. The process of claim 1 wherein method of the plasma source is computer controlled.

3. An apparatus which comprises:
   (a) a stage for a substrate to be modified in a work region which is 100×100×100 microns or less on the substrate; and
   (b) a plasma source which can impinge a beam of matter or radiation from an adjacent plasma which is 100 microns or less in cross-sectional width into the work region so as to modify the surface of the substrate in at least one dimension.

4. The apparatus of claim 3 wherein method of the plasma source is moveable and computer controlled.

5. A process for manufacturing devices by modifications of a substrate on a micron or less scale which comprises:
   (a) providing a substrate with a surface which provides a 100×100×100 microns work region or less on a stage of an apparatus which allows precisely accurate three dimensional movement in the work region;
   (b) viewing the substrate with an imaging device with a screen for visualization of the work region of the substrate in three dimensions;
   (c) impinging beams of matter or radiation from a plasma source adjacent to the work region having a beam cross-sectional width of 100 microns or less in width into the work region on the surface to modify the substrate in at least one dimension in the work region; and
   (d) viewing the modified surface of the substrate with the imaging device to determine that the substrate has been modified to provide the device.

6. The process of claim 5 wherein the beam is free radicals, ions or atoms as the matter which modifies the substrate.

7. The process of claim 5 wherein the beam is from an ion or electron source which modifies the substrate.

8. The process of claim 5 wherein a laser beam is used for detecting the modification of the surface by the imaging device.

9. The process of claim 5 wherein the imaging device is an atomic force microscope with a probe contacting the surface of the substrate to determine the modifications of the substrate over time during the process.

10. The process of claim 9 wherein the probe enables manipulation of components placed on the substrate to position the components in the work region.

11. The process of claim 9 wherein the probe is used to cut into the surface of the substrate.

12. The process of claim 5 wherein the beam is a plasma which modifies the surface of the substrate by etching.

13. The process of claim 5 wherein the beam is a plasma which modifies the surface of the substrate by depositing a material on the surface from the plasma.

14. The process of claim 13 wherein the material deposited is a bonding material for a component mounted on the surface of the substrate.

15. The process of claim 5 wherein the device is a MEMS device.

16. The process of claim 5 wherein the beam is used to modify the surface to enhance visualization of the surface.

* * * * *

UNITED STATES PATENT AND TRADEMARK OFFICE
CERTIFICATE OF CORRECTION

| | | |
|---|---|---|
| PATENT NO. | : 7,262,408 B2 | Page 1 of 1 |
| APPLICATION NO. | : 11/452891 | |
| DATED | : August 28, 2007 | |
| INVENTOR(S) | : Jes Asmussen et al. | |

It is certified that error appears in the above-identified patent and that said Letters Patent is hereby corrected as shown below:

Column 5, line 5, "approaches especially" should be --approach is especially--.

Column 7, line 37, "obotic" should be --robotic--.

Signed and Sealed this

Fourth Day of March, 2008

JON W. DUDAS
*Director of the United States Patent and Trademark Office*

UNITED STATES PATENT AND TRADEMARK OFFICE
CERTIFICATE OF CORRECTION

PATENT NO. : 7,262,408 B2
APPLICATION NO. : 11/452891
DATED : August 28, 2007
INVENTOR(S) : Jes Asmussen et al.

It is certified that error appears in the above-identified patent and that said Letters Patent is hereby corrected as shown below:

In the Specification:

At column 1, lines 14-16, please delete:

"This invention was funded under National Science Foundation of Grant No. NSF03-043. The U.S. government has certain rights to this invention."

and insert:

-- This invention was made with government support under 0500372 awarded by the National Science Foundation. The government has certain rights in the invention. --

Signed and Sealed this
Twenty-fourth Day of May, 2016

Michelle K. Lee
*Director of the United States Patent and Trademark Office*